(12) United States Patent
Chang et al.

(10) Patent No.: US 12,050,264 B2
(45) Date of Patent: Jul. 30, 2024

(54) EMISSIVE DISPLAY CONFIGURED WITH THROUGH-DISPLAY ZERO-DISTANCE PROXIMITY SENSOR

(71) Applicant: Google LLC, Mountain View, CA (US)

(72) Inventors: YungSheng Chang, Taipei (TW); YanJang Jiang, Taipei (TW)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/006,548

(22) PCT Filed: Jul. 30, 2020

(86) PCT No.: PCT/US2020/070335
§ 371 (c)(1),
(2) Date: Jan. 23, 2023

(87) PCT Pub. No.: WO2022/025971
PCT Pub. Date: Feb. 3, 2022

(65) Prior Publication Data
US 2023/0296771 A1    Sep. 21, 2023

(51) Int. Cl.
*G01S 17/08*    (2006.01)
*G06F 3/041*    (2006.01)
(Continued)

(52) U.S. Cl.
CPC ............ *G01S 17/08* (2013.01); *G06F 3/0412* (2013.01); *G06F 3/0418* (2013.01); *H10K 59/40* (2023.02);
(Continued)

(58) Field of Classification Search
CPC .......... G01J 1/1626; G01J 1/18; G01J 1/4204; G01J 2001/1694; G02F 1/13318;
(Continued)

(56) References Cited

U.S. PATENT DOCUMENTS 10,474,286 B2 * 11/2019 Bae .................... G06F 3/03545
2019/0319133 A1    10/2019 Kang et al.
2020/0209729 A1    7/2020 Chen et al.

FOREIGN PATENT DOCUMENTS

CN    103353621 A    10/2013
WO    2019149044 A1    8/2019

OTHER PUBLICATIONS

Response to Communication Pursuant to Rules 161(1) and 162 EPC dated Feb. 3, 2023, from counterpart European Application No. 20761119.5, filed Jul. 27, 2023, 11 pp.
(Continued)

*Primary Examiner* — Nelson M Rosario
(74) *Attorney, Agent, or Firm* — Shumaker & Sieffert, P.A.

(57) ABSTRACT

A mobile computing device includes one or more processors, an emissive display that includes a touchscreen, and a proximity sensor that generates a quantitative output signal. The one or more processors transition, in response to the quantitative output signal decreasing below a low threshold value, operation of the sensor to a high sensitivity state; transition, in response to the quantitative output signal increasing above a high threshold value, operation of the sensor to the low sensitivity state; and deactivate the touchscreen and/or the emissive display when the touchscreen and/or the emissive display is activated and when the quantitative output signal increases above an high threshold value and to activate the touchscreen and/or the emissive display when the touchscreen and/or the emissive display is deactivated and when the quantitative output signal is below a low threshold value, the low threshold value being less than the high threshold value.

20 Claims, 11 Drawing Sheets

(51) Int. Cl.
*H10K 59/40* (2023.01)
*H10K 59/80* (2023.01)
*H10K 59/90* (2023.01)

(52) U.S. Cl.
CPC ......... *H10K 59/8794* (2023.02); *H10K 59/90* (2023.02)

(58) Field of Classification Search
CPC .. G02F 1/133555; G06F 3/042; G06F 3/0421; G09G 3/3208; G09G 2354/00; G09G 2360/145; H01L 27/1248; H01L 29/78603; H01L 31/02164; H01L 31/101; H10K 50/828; H10K 50/844; H10K 59/60; H10K 59/12; H10K 59/126; H10K 59/40
See application file for complete search history.

(56) References Cited

OTHER PUBLICATIONS

International Search Report and Written Opinion of International Application No. PCT/US2020/070335 dated Apr. 22, 2021, p. 13.
International Preliminary Report on Patentability from International Application No. PCT/US2020/070335 dated Feb. 9, 2023, 10 pp.

\* cited by examiner

EMISSIVE DISPLAY CONFIGURED WITH THROUGH-DISPLAY ZERO-DISTANCE PROXIMITY SENSOR

FIELD OF THE DISCLOSURE

The present disclosure relates to flat panel displays and more specifically to displays for a mobile device that include a through-the-display proximity sensor that is configured to detect objects near to or abutting an outer surface of the display.

BACKGROUND

Expanding a display to cover more area of a mobile device (e.g., mobile phone, tablet, etc.) may be desirable from, at least, a user experience standpoint. However, electro-optical devices positioned on a side of the mobile device that also includes the display (e.g., a front-facing camera, a light sensor, a proximity sensor, etc.) may compete for real estate on the side of the device that includes the display. Thus, the size of the emissive area of the display may have to be compromised to accommodate other sensors on display side of the device.

SUMMARY

In a first general aspect, a mobile computing device an emissive display that includes a touchscreen and a proximity sensor. The proximity sensor includes a transmitter configured to transmit electromagnetic radiation through the display and a receiver of electromagnetic radiation configured to receive electromagnetic radiation transmitted by the transmitter, reflected off an object facing the emissive display and received through the emissive display. The proximity sensor is configured for generating a quantitative output signal based on an amount of the received electromagnetic radiation, and the transmitter is configured to transmit a first predetermined amount of light when a distance between the object and the display is greater than a near threshold distance between the object and the display and is configured to transmit a second predetermined amount of light when the distance between the object and the display is less than the near threshold distance. The second predetermined amount is greater than the first predetermined amount. A processor is configured for receiving the generated quantitative output signal, and memory stores instructions that, when executed by the processor, cause the processor to deactivate the touchscreen and/or the emissive display when the touchscreen and/or the emissive display is activated and when the quantitative output signal increases above a deactivate threshold value and to activate the touchscreen and/or the emissive display when the touchscreen and/or the emissive display is deactivated and when the quantitative output signal is below an activate threshold value, the activate threshold value being less than the deactivate threshold value.

Implementations can include one or more of the following features, alone, or in any combination with each other. For example, the mobile computing can further include an opaque layer between the display and the proximity sensor, with the opaque layer having at least one opening through which the transmitted and received electromagnetic radiation pass.

The mobile can include an opaque layer between the display and the proximity sensor, with the opaque layer having a first opening configured for transmitting light from the transmitter through the display and a second opening, distinct from the first opening, configured for receiving light through the display to the receiver, where the first and second openings are spatially separated from each other.

A value of the generated quantitative output signal can be proportional to the amount of the received electromagnetic radiation for amounts below a saturation value, and the value of the generated quantitative output signal can be approximately constant for amounts above the saturation value.

The transmitter of the proximity sensor can be configured to receive a signal to increase an amount of transmitted light from the first predetermined amount to the second predetermined amount when a value of the generated quantitative output signal decreases below a low threshold value.

The transmitter of the proximity sensor can be configured to receive a signal to decrease an amount of transmitted light from the second predetermined amount to the first predetermined amount when a value of the generated quantitative output signal increases above the high threshold value.

The display can include an active matrix organic light emitting diode (AMOLED) display.

The display can include a high-resolution area and a through-transmissive area, with the through-transmissive area including pixels that are spaced in a repeating pattern according to a first pixel density that is lower than a second pixel density of the high-resolution area, and the proximity sensor can be positioned behind the through-transmissive area, such that the transmitted and received electromagnetic radiation pass through the through-transmissive area.

The opaque layer can include a metal layer configured to spread heat through the metal layer.

In another general aspect, a mobile computing device includes an emissive display that includes a touchscreen, a proximity sensor, a processor, and a memory. The proximity sensor includes a transmitter configured to transmit a predetermined amount of electromagnetic radiation through the display and a receiver of electromagnetic radiation configured to receive electromagnetic radiation transmitted by the transmitter, reflected off an object facing the emissive display and received through the emissive display. The proximity sensor is configured for generating a quantitative output signal based on an amount of the received electromagnetic radiation, where a value of the generated quantitative output signal is proportional, with a first proportionality constant, to the amount of received electromagnetic radiation for amounts below a first saturation value and is approximately constant for amounts above the first saturation value when a distance between the object and the display is greater than a near threshold distance between the object and the display and where a value of the generated quantitative output signal is proportional, with a second proportionality constant, greater than the first proportionality constant, to the amount of received electromagnetic radiation for amounts below a second saturation value and is approximately constant for amounts above the second saturation value when a distance between the object and the display is less than a near threshold distance between the object and the display. The processor is configured for receiving the generated quantitative output signal. The memory stores instructions that, when executed by the processor, cause the processor to deactivate the touchscreen and/or the emissive display when the quantitative output signal is above a deactivate threshold value and to activate the touchscreen and/or the emissive display when the quantitative output signal is below an activate low threshold value, the activate threshold value being less than the deactivate threshold value.

Implementations can include one or more of the following features, alone, or in any combination with each other. For example, the mobile computing device can further include an opaque layer between the display and the proximity sensor, with the opaque layer having at least one opening through which the transmitted and received electromagnetic radiation pass.

The mobile computing device can further include an opaque layer between the display and the proximity sensor, with the opaque layer having a first opening configured for transmitting light from the transmitter through the display and a second opening, distinct from the first opening, configured for receiving light through the display to the receiver, wherein the first and second openings are spatially separated from each other.

The receiver of the proximity sensor can be configured to receive a signal to use the second proportionality constant rather than the first proportionality constant when a value of the generated quantitative output signal decreases below the low threshold value.

The receiver of the proximity sensor can be configured to receive a signal to use the first proportionality constant rather than the second proportionality constant when a value of the generated quantitative output signal increases above the high threshold value.

The signal received by the proximity sensor can be received from the processor.

The display can include an active matrix organic light emitting diode (AMOLED) display.

The display can include a high-resolution area and a through-transmissive area, with the through-transmissive area including pixels that are spaced in a repeating pattern according to a first pixel density that is lower than a second pixel density of the high-resolution area, and the proximity sensor can be positioned behind the through-transmissive area, such that the transmitted and received electromagnetic radiation pass through the through-transmissive area.

The opaque layer can include a metal layer configured to spread heat through the metal layer.

In another general aspect, mobile computing device includes an emissive display, wherein the display includes a touchscreen and a proximity sensor that includes a transmitter configured to transmit electromagnetic radiation through the display and a receiver of electromagnetic radiation configured to receive electromagnetic radiation transmitted by the transmitter, reflected off an object facing the emissive display and received through the emissive display. The proximity sensor is configured for generating a quantitative output signal based on an amount of the received electromagnetic radiation, and proximity sensor is configured to operate in a low sensitivity state and in a high sensitivity state. When the sensor is operating in the low threshold state and the quantitative output signal decreases below a low threshold value, operation of the sensor is transitioned to the high sensitivity state. When the sensor is operating in the high threshold state and the quantitative output signal increases above a high threshold value that is greater than the low threshold value, operation of the sensor is transitioned the low sensitivity state. The mobile computing device also includes a processor configured for receiving the generated quantitative output signal and memory storing instructions that, when executed by the processor cause the processor to deactivate the touchscreen and/or the emissive display when the quantitative output signal is greater than a deactivate threshold value and to activate the touchscreen and/or the emissive display when the quantitative output signal is below an activate threshold value, the activate threshold value being less than the deactivate threshold value.

Implementations can include one or more of the following features, alone, or in any combination with each other. For example, the high threshold value can be less than the deactivate threshold value, and the low threshold value can be greater than the activate threshold value.

In the low sensitivity state the transmitter can transmit a first predetermined amount of light and in the high sensitivity state the transmitter can transmit a second predetermined amount of light, the second predetermined amount being greater than the first predetermined amount.

The mobile computing device can further include an opaque layer between the display and the proximity sensor, the opaque layer having at least one opening through which the transmitted and received electromagnetic radiation pass.

The mobile computing device can further include an opaque layer between the display and the proximity sensor, the opaque layer having a first opening configured for transmitting light from the transmitter through the display and a second opening, distinct from the first opening, configured for receiving light through the display to the receiver, where the first and second openings are spatially separated from each other.

The opaque layer can include a metal layer configured to spread heat through the metal layer.

A value of the generated quantitative output signal can be proportional to the amount of the received electromagnetic radiation for amounts below a saturation value, and the value of the generated quantitative output signal can be approximately constant for amounts above the saturation value.

The transmitter of the proximity sensor can be configured to receive a signal to increase an amount of transmitted light from the first predetermined amount to the second predetermined amount when a value of the generated quantitative output signal decreases below the low threshold value.

The transmitter of the proximity sensor can be configured to receive a signal to decrease an amount of transmitted light from the second predetermined amount to the first predetermined amount when a value of the generated quantitative output signal increases above the high threshold value.

The display can include an active matrix organic light emitting diode (AMOLED) display.

The display can include a high-resolution area and a through-transmissive area, the through-transmissive area including pixels that are spaced in a repeating pattern according to a first pixel density that is lower than a second pixel density of the high-resolution area, and the proximity sensor can be positioned behind the through-transmissive area, such that the transmitted and received electromagnetic radiation pass through the through-transmissive area.

A value of the generated quantitative output signal can be proportional, with a first proportionality constant, to the amount of received electromagnetic radiation, for amounts below a first saturation value, when the proximity senor is operating in the low sensitivity state, and a value of the generated quantitative output signal can be proportional, with a second proportionality constant, to the amount of received electromagnetic radiation, for amounts below a second saturation value, when the proximity senor is operating in the high sensitivity state, the second proportionality constant being different from the first proportionality constant.

The receiver of the proximity sensor can be configured to receive a signal to use the second proportionality constant rather than the first proportionality constant when a value of the generated quantitative output signal decreases below the low threshold value.

The receiver of the proximity sensor can be configured to receive a signal to use the first proportionality constant rather than the second proportionality constant when a value of the generated quantitative output signal increases above the high threshold value.

The mobile computing device can further include an amplifier configured to amplify a signal based on an amount of electromagnetic radiation received by the receiver, the amplifier having a first gain when the sensor is operating in the low sensitivity state and a second gain when the sensor is operating in the high sensitivity state.

BRIEF DESCRIPTION OF THE DRAWINGS

The components in the drawings are not necessarily drawn to scale and may not be in scale relative to each other. Like reference numerals designate corresponding parts throughout the several views.

DETAILED DESCRIPTION

Figure 1A:
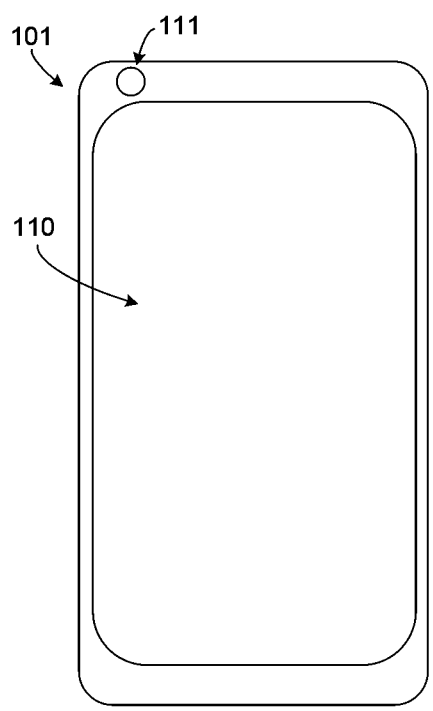
FIG. 1A depicts a top (front) surface of a mobile computing device including a display and an optical device that occupy different portions of the front surface.

The present disclosure describes a flat panel display (i.e., display) that can be used with a mobile device (e.g., mobile phone, tablet, etc.). The front surface of a mobile device includes a display typically operating as a graphic user interface (GUI) and one or more optical devices operating as sensors/emitters in areas facing the front surface. The one or more optical devices can be configured for a variety of functions, including (but not limited to) sensing lighting conditions (e.g. light sensor), sensing proximity of objects near the display (e.g., electromagnetic sensor), capturing images (e.g., front-facing camera), and/or to providing light (e.g., flash).

A proximity sensor may include a transmitter and a receiver of electromagnetic radiation, which are used to determine proximity of the display to an object that reflects electromagnetic radiation transmitted by the transmitter, which radiation is then reflected by the object and received by the receiver. For example, when a percentage of the transmitted radiation intensity received at the receiver, after being reflected by an object, exceeds a threshold value, a signal from the proximity sensor may determine that the display is closer to the object than a threshold distance.

The information provided by the proximity sensor may be used in a variety of different ways. For example, when information from the proximity sensor is used to determine that the display is closer to an object than a threshold distance, the functionality of some features of the mobile device may be changed. For example, when a portion of the display is very close to, or touching an object, this may be understood to mean that the display of the device is located in a place that is unviewable to the user of the device (e.g., in the user's pocket, under a book or pillow, or against the user's face/ear while the device is used for a telephone call), such that the display of the device can be disabled to save power that ordinarily would be consumed by the operation of the display. In another example, when a portion of the display is very close to, or touching an object, and when the display includes a touchscreen, this may be understood to mean that the display of the device is located in a place that is unviewable to the user of the device and in contact with an object that could trigger responses from the touchscreen (e.g., in the user's pocket or against the user's face/ear while the device is used for a telephone call), such that touchscreen functionality of the display can be disabled to avoid accidental touch inputs to the display that could cause unintended operations of the device (e.g., unintended muting of a microphone during a phone call or unintended disconnection of a phone call while the device is held to a user's ear, unintended launching of an application while the device is in a pocket of the user, etc.).

Proximity sensors are used in many mobile devices. Recent advances in emissive display technology (e.g., active matrix organic light emitting diode (AMOLED)) facilitate extending the emissive (i.e., active) area of the display towards (e.g., to) the edges of the mobile device. By extending the active area of the display towards the edges of the mobile device, a user may experience the benefits of a larger display without the drawbacks of a larger device. However, this may leave insufficient space for a proximity sensor or other optical devices outside the area of the emissive display on the front side of the mobile device.

The emissive display disclosed herein is configured to share the front surface of a mobile device with a proximity sensor so that the active area of the display can be extended to the edges, without the need for leaving a gap in the display, or space around the display, for the proximity sensor. Accordingly, one or more portions of the disclosed display covering the proximity sensor can be configured so that the proximity sensor, positioned behind the display, can transmit and receive electromagnetic radiation through the display.

In an ideal proximity sensor, for a constant intensity of light emitted from the transmitter of the sensor, the intensity of light received at the receiver of the sensor increases monotonically as the distance of the proximity sensor to an object decreases. However, when a proximity sensor is under or behind a display of a device, because the transmitter and the receiver of the proximity sensor are spatially separated from each other, and because components of the display through which the transmitted and received radiation pass interfere with the radiation, the amount of light received at the receiver of the under-the-display proximity sensor may not increase monotonically with decreasing distance of the display from an object for constant intensity emitted from the transmitter. Thus, techniques are needed to correct the output of the proximity sensor, so that the output can be used to accurately determine proximity of the display to an object.

Traditionally, the display and the optical devices located on a surface of the device that includes the display have occupied separate areas of the front surface. For example, FIG. 1A depicts a mobile device 101 having a display 110 and a camera 111 that occupy different portions of the front surface. In addition to the camera 111, the front surface of the display of the mobile device 101 can include other optical elements that receive and sense optical signals, such as, for example, a proximity sensor.

Figure 1B:
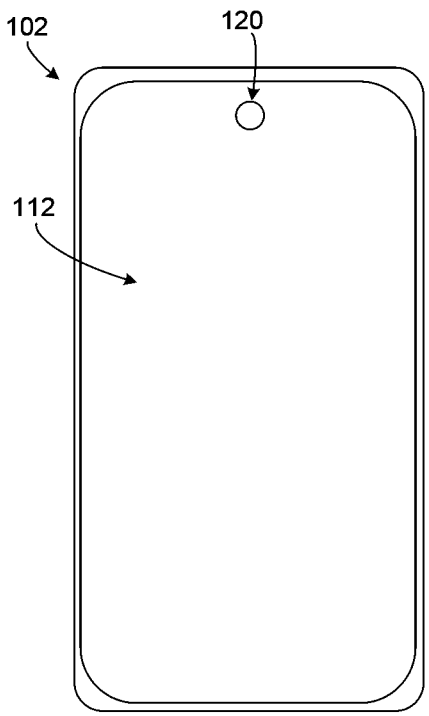
FIG. 1B depicts a top (front) surface of a mobile computing device including a display with a proximity sensor positioned behind an area of the display according to a possible implementation of the disclosure.

FIG. 1B illustrates a mobile device 102 with a display 112 that extends towards the edges of the device and that occupies are larger portion of the surface of the device 102 than does the display 110 of device 101. Unlike mobile devices in which the display is excluded from an area reserved for optical devices, the light-emitting (i.e., active) area of the display 112 extends over substantially the entire front surface. Accordingly, nearly the entire front surface of the mobile device 102 may be used to present color, black-and-white, or gray-scale images, graphics, and/or characters. In some implementations, the display 112 can include one or more areas 120 behind which (i.e., below which) a proximity sensor may be disposed.

The size, shape, and/or position of the area 120 may be implemented variously. For example, the area 120 shown in FIG. 1B has a rounded (e.g., circular) shape and is positioned apart from edges of the display 112, but this need not be the case. For example, the area 120 can have rectangular in shape and can be positioned along an edge of the display 112.

Figure 2A:
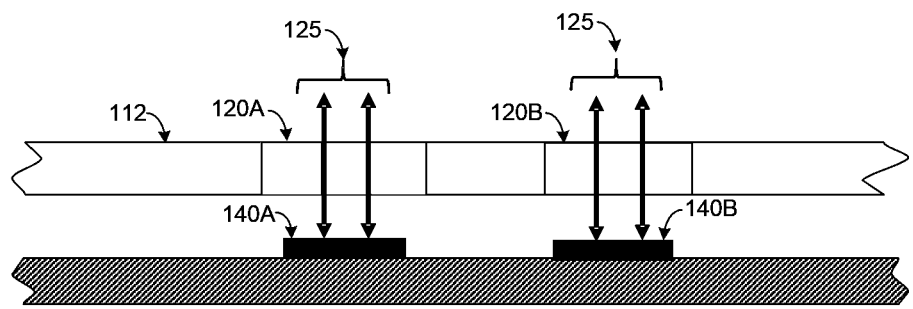
FIG. 2A depicts a side, cross-sectional view of a mobile device including a plurality of optical devices, each positioned behind a respective through-transmissive area of an emissive (e.g. OLED, micro-OLED or micro LED) display according to a possible implementation of the disclosure.
Figure 2B:
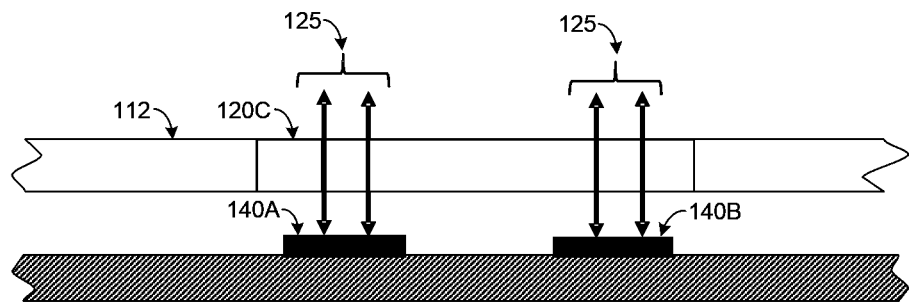
FIG. 2B depicts a side, cross-sectional view of a mobile device including a plurality of optical devices positioned by a single through-transmissive area of an emissive display according to a possible implementation of the disclosure.

FIG. 2A depicts a side, cross-sectional view of a mobile device having a display 112 with areas 120A, 120B through which electromagnetic radiation can be transmitted to an underlying optical device, for example, a camera or a proximity sensor. The mobile device can include multiple optical devices 140A, 140B, each positioned behind a different area 120A, 120B. FIG. 2B depicts a side, cross-sectional view of a mobile device having a display 112 with a single region for use by the multiple optical devices 140A, 140B.

The optical devices 140A, 140B may transmit and/or receive electromagnetic radiation 125 through the areas 120A, 120B, 120C. While the disclosure may be generally applied to any optical device configured to transmit or receive electromagnetic radiation (e.g., from the millimeter wave, visible, or infrared portions of the electromagnetic spectrum), the particular implementation of a proximity sensor configured to receive visible light and/or infrared light will be considered throughout the disclosure.

In some implementations, the areas 120A, 120B, 120C (i.e., portion) of the display 112 through which light passes to an underlying sensor may have the same pixel density and/or pixel arrangement as in the rest of the display. In some implementations, the areas 120A, 120B, 120C (i.e., portion) of the display 112 through which light passes to or from an underlying sensor may have a pixel density and/or pixel arrangement that is different from a pixel density and/or pixel arrangement for the rest of the display. For example, in some implementations, the display region of the rest of display may have a pixel resolution that is higher than the pixel resolution of the through-transmissive portion 120A, 120B, 120C of the display.

Figure 3A:
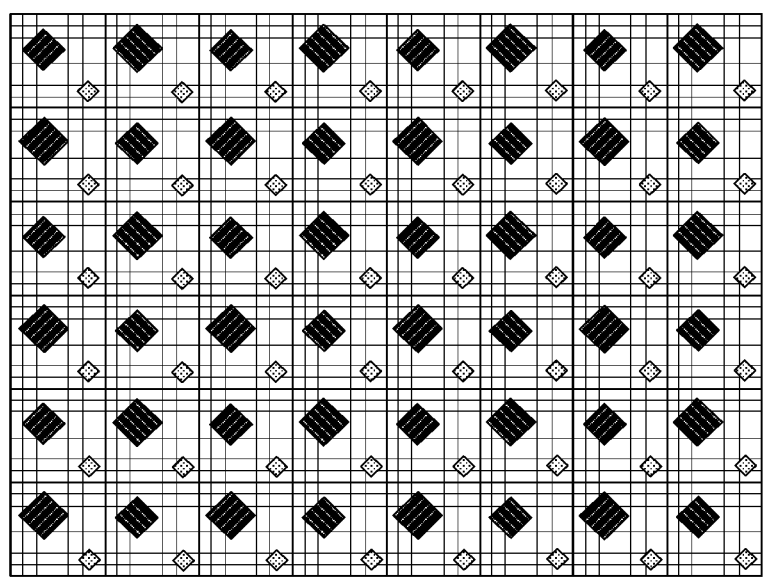
FIG. 3A depicts a top (front) view of pixels and signal lines of a high-resolution portion of an emissive display according to a possible implementation of the disclosure.
Figure 3B:
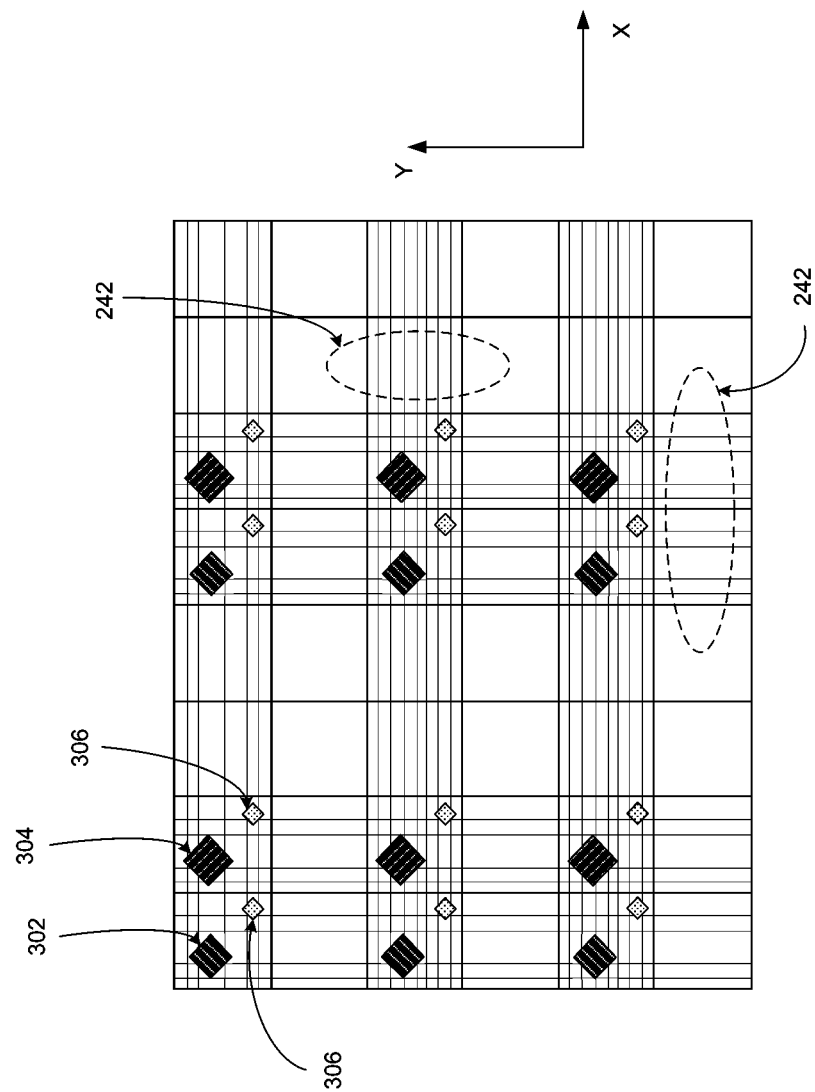
FIG. 3B depicts a top (front) view of pixels and signal lines of a reduced-resolution portion of an emissive display according to a possible implementation of the disclosure.

FIG. 3A depicts possible pixels arranged in a first repeating pattern and signal lines of a high-resolution portion of an emissive display, while FIG. 3B depicts pixels arranged in a second repeating pattern and signal lines of a reduced-resolution portion of an emissive display. In FIG. 3A and in FIG. 3B, pixels in the display can include a plurality of light emitting elements (e.g., light emitting diodes) that emit different colors, so that all visible colors can be produced by a pixel by mixing amount of light from the different elements. For example, in some implementations, a pixel can include a red LED 302, a blue LED 304 and two green LEDs 306. The reduced-resolution portion may allow more light to pass through the display than the high-resolution portion of the display. The light passing through the display, however, may experience signal lines 242 running in a vertical (y) direction and/or in a horizontal (x) direction.

Figure 4:
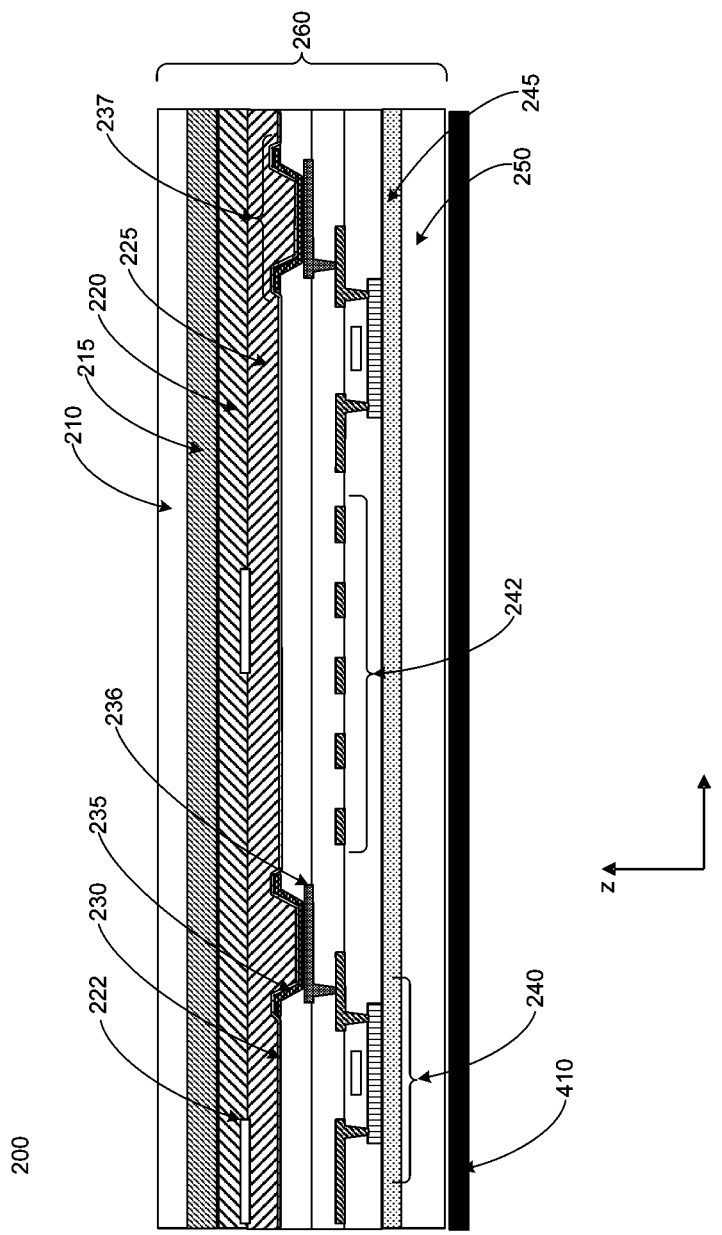
FIG. 4 depicts a possible side, cross-sectional view of the emissive display shown in FIG. 3B.

FIG. 4 illustrates a side, cross-sectional view of an emissive display suitable for use with the mobile device of FIG. 1. The display shown is an AMOLED display. While the principles of the disclosure may be applied to various other display technologies, the implementation of an AMOLED display will be considered throughout the disclosure.

As shown in FIG. 4, the AMOLED display 200 includes a plurality of layers that make up a display panel 260. The layers include a cover glass layer 210 that can form the front surface of the mobile device 102. In a possible implementation, the display 200 can include a polarizer film layer 215. The display 200 can also include a touch sensor layer 220 that includes touch sensor electrodes 222. Pixels 237 for the display are formed from a cathode layer 230, an OLED emitter stack 235, and separate elements of an anode layer 236. Elements of the anode layer 236 may be reflective so that light is directed in a vertical (z) direction from the anode layer 236. An element of the anode layer 236 can be coupled to a thin film transistor (TFT) structure 240 that includes a source, a gate, and a drain, which can be controlled by electrical signals transmitted over signal lines 242. The display 200 can further include a transparent barrier layer 245 that includes, for example, SiNx or SiONx and a transparent substrate layer 250 that includes, for example, polyimide (PI). An opaque layer/film 410 for heat spreading and electrical shielding can be located below the display panel 260 to protect the display from localized hot spots due to heat-generating elements in the mobile device, such as, for example, a CPU, a GPU, etc., as well as from electrical signals/electrical noise from electrical components in the device located below the display 200.

The layers of the display 200 may include transparent and non-transparent circuit elements. For example, the TFT structure 240, the pixels 237, the signal lines 242, and/or touch sensor electrodes 222 may all block light from propagating through the display 200. Light can be either reflected or absorbed by the non-transparent (i.e., opaque) circuit elements. Additionally, the circuit elements may define gaps (i.e., periodic slits) with which the light may interact. For example, light may be diffracted by gaps formed between adjacent circuit elements in the same layer. Light may also be diffracted by gaps between circuit elements in different layers, although the effect may be weaker than the diffraction due to elements of the same layer.

Figure 5:
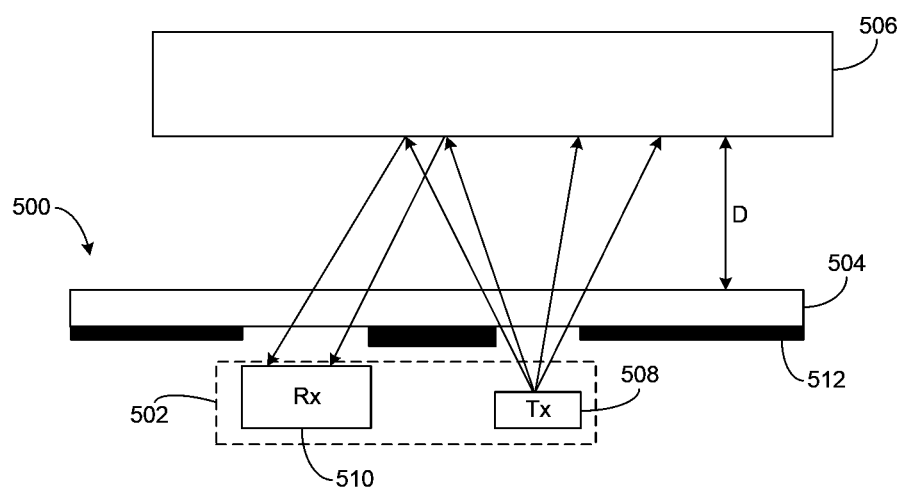
FIG. 5 is a schematic diagram of mobile device that includes a proximity sensor located under a display panel interacting with an object that is a distance away from a front surface of the display panel.

FIG. 5 is a schematic diagram of mobile device 500 that includes a proximity sensor 502 located under a display panel 504 interacting with an object 506 that is a distance, d, away from a front surface of the display panel 504. The proximity sensory 502 includes a transmitter 508 and a receiver 510 of electromagnetic radiation (e.g., infrared light). An opaque layer 512 for heat spreading and/or electrical shielding can be disposed between the display panel 504, and the proximity sensor 502 and/or an opaque layer 512 can be disposed between a layer that includes OLED emitters of the display and the proximity sensor 502. The opaque layer 512 can include one or more openings through which electromagnetic radiation can pass when transmitted to the object 506 and when received from the object. In some implementations, the electromagnetic radiation transmitted to the object 506 and received from the object can pass through different openings in the opaque layer 512 that are spatially separated from each other, and in some implementations, the electromagnetic radiation transmitted to the object 506 and received from the object can pass through the same opening, The proximity sensor 502 can operate by determining an amount of electromagnetic radiation (e.g., an intensity) that is emitted from the transmitter 508, reflected off the object 506, and then is received by the receiver 510. The amount of light received by the receiver 510 can be used as a signal for how close the front surface of the display panel 504 is to an object 506 under the assumption that the amount of light received by the intensity of received light increases monotonically with decreasing distance, d, between the display panel 504 and the object 506. The amount of light received at the receiver can be correlated with a distance between the object and the display panel, where the correlation is based on either an empirical calibration between received intensity and distance, or is based on a theoretical model of the propagation of light from the transmitter 508 to the object 506 and from the object 506 to the receiver 510, or a combination of the two.

Figure 6:
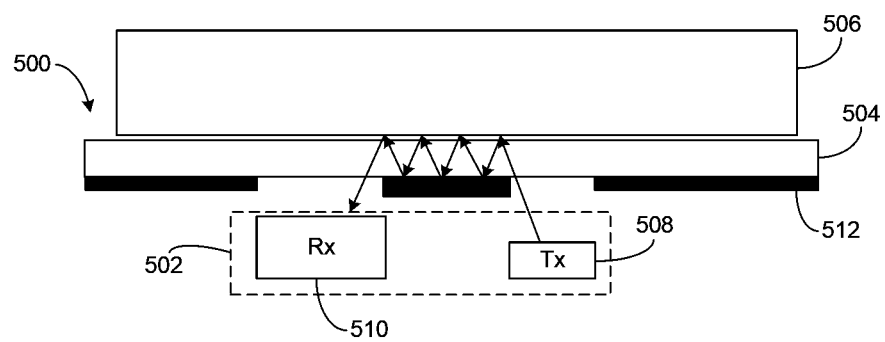
FIG. 6 is a schematic diagram the mobile device that includes the proximity sensor located under the display panel interacting with the object, when the object is very close to and/or touching, the front surface of the display panel.

FIG. 6 is a schematic diagram the mobile device 500 that includes the proximity sensor 502 located under the display panel 504 interacting with the object 506, when the object is very close to (e.g., within 3 mm of) and/or touching, the front surface of the display panel 504. As seen from FIG. 6, when the object 506 is very close to and/or touching the display panel 504, the light emitted from the transmitter 508 and reflected by the object 506 can undergo multiple reflections before it is received by the receiver 510 of the proximity sensor 502. Each reflection can be associated with some loss of intensity (e.g., due to scattering and/or absorption of light), such that an intensity of light received by the receiver 510 does not increase monotonically with decreasing distance, d, between the object 506 and the display panel 504, because the light may undergo more reflections when the display panel 504 and the object 506 are very close, compared to when they are separated by a larger distance. Because the intensity of received light does not increase monotonically with decreasing distance, intensity values exist that correspond to more than one distance between the display panel 504 and the object 506, which can lead to irregular and poor performance of the proximity sensor 502. Although the increased number of reflections for short distances between the display panel 504 and the object 506 is shown in FIG. 6 as being, at least in part, due to reflections off the opaque layer 512 between the transmitter 508 and the receiver 510, a non-monotonic intensity at the receiver 510 as a function of distance between the display panel 504 and the object also can exist even when a single opening in the opaque layer 512 is used for light to be transmitted and received through, for example, due to reflections, scatterings and absorptions of light by elements within the display panel 504.

Figure 7:
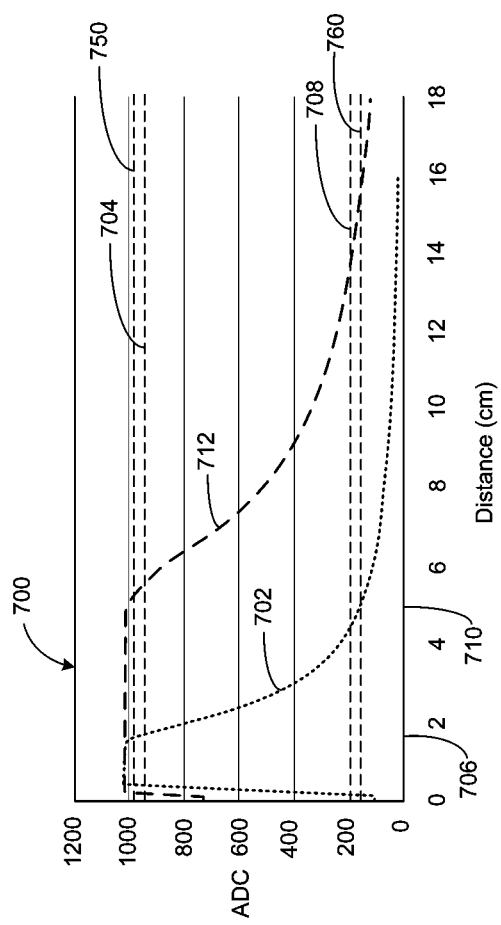
FIG. 7 is a graph of example relationships between an output from the proximity sensor as a function of distance between the display panel and the object.

FIG. 7 is a graph 700 of example relationships between an output from the proximity sensor 502 as a function of distance between the display panel 504 and the object 506. The graph 700 depicts, for example, a curve 702 representing a signal due the proximity sensor 502, which can be used to control functions of the device (e.g., activating and deactivating the touchscreen and or the display), on the y-axis as a function of distance on the x-axis. In an example, the signal represented on the y-axis can be an quantitative output signal from an analog-to-digital converter (ADC), where the digital ADC signal (ranging from 0 to 1023 in the FIG. 7) is proportional to an amount of light received at the receiver 510 of the proximity sensor (i.e., ADC signal=$\alpha$f (I)), where $\alpha$ is a proportionality constant and f(I) represents a function of an intensity of electromagnetic radiation received at the receiver), except when the receiver is saturated by an amount of light that exceeds a saturation value, such that the ADC signal is equal to its maximum value (e.g., 1023).

In an implementation, the signal due to the proximity sensor can be received by a CPU of the mobile device and used by the CPU to determine whether to activate/deactivate (e.g., enable/disable) one or more of the touchscreen, the display, or other components of the mobile device. For example, when a touchscreen and/or display of the mobile device 500 are enabled and then the ADC signal output from the proximity sensor increases above a disable threshold value 750 (e.g., when the distance between the display panel and the object decreases below a low threshold distance 706 on curve 702), this may be understood as a signal to deactivate the touchscreen and/or the display. When a touchscreen and/or display of the mobile device 500 are disabled and then the ADC signal given by curve 702 decreases below an enable threshold value 760 (e.g., when the distance between the display panel and the object increases above a high threshold distance 710), this may be understood as a signal to activate the touchscreen and/or the display.

When the distance between display panel 504 and the object is very close to zero (e.g., less than 3 mm), to prevent the touchscreen and/or display from being activated from a deactivated state, for example, as a consequence of the ADC value of curve 702 dropping below the enable threshold value 760, the deactivating and reactivating of the touchscreen and/or display can be governed by the ADC values of a second curve 712 when the object 506 is close to the display panel. In some implementations, the second curve 712 can differ from the first curve 702, in that the intensity of light emitted from the transmitter 508 can be greater for curve 712 than for curve 702. In other words, curve 702 can correspond to a first predetermined intensity of light being transmitted by the transmitter 508, and curve 712 can correspond to a second predetermined intensity of light being transmitted by the transmitter 508, where the second intensity is greater than the first intensity (e.g., three times greater). Thus, the proximity sensor can be considered to operated in a low sensitivity state, as represented by curve 702, or in a high sensitivity state, as given by curve 712.

In some implementations, the gain of an amplifier in the receiver 510 used to amplify a received optical signal can be greater for curve 712 than for curve 702. In some implementations, a conversion factor for converting an analog signal (amplified or not) generated by the receiver 510 into a digital signal in the receiver 510 can be greater for curve 712 than for curve 702. Thus, where ADC signal=αf(I)), the proportionality constant, α, can be different for curves 702 and 712.

Figure 8:
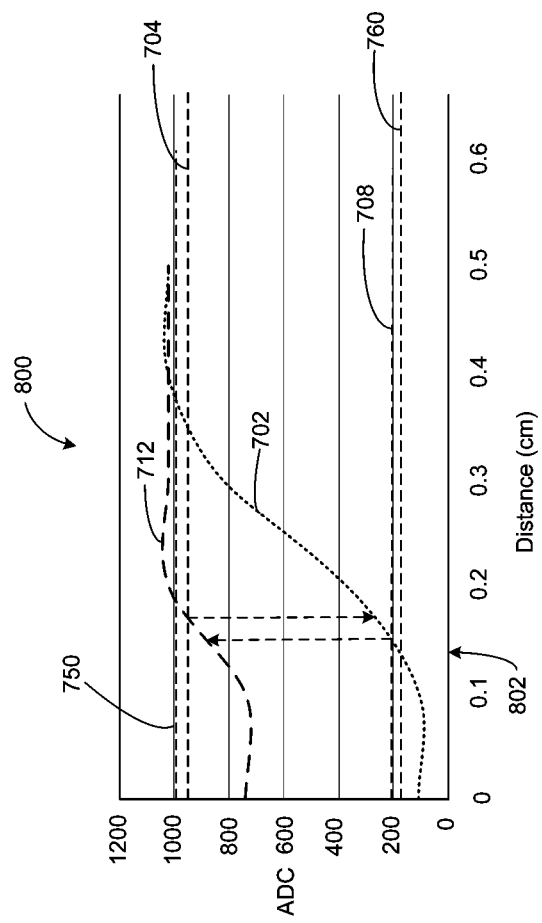
FIG. 8 is a graph of the portions of curves and for distances between the display panel and the object that are very small and about equal to a near threshold distance.

FIG. 8 is a graph 800 of the portions of curves 702 and 712 for distances between the display panel 504 and the object 506 that are very small (e.g., less than 6 mm) and near a near threshold distance 802, illustrating how the proximity sensor can switch from outputting an ADC signal based on curve 702 to outputting an ADC signal based on curve 712. When a y-axis value of the curve 702 drops below a low threshold switching value 708 at about a near threshold distance 802, the crossing of this threshold value can be used as a signal to the proximity sensor to switch from outputting a signal based on curve 702 to outputting a signal based on curve 712. For example, when the ADC value of the curve 702 drops below the low threshold value 708, this can be taken as a signal to the proximity sensory to increase the intensity of light emitted from the transmitter, or as a signal to change the ADC conversion, such as by changing the gain of an amplifier in the receiver 510, or causing the conversion factor of the ADC to increase (i.e., by changing a proportionality constant used in a conversion of the received light intensity signal to the quantitative signal output from the sensor). The increased transmitter light output (or other corresponding change in the conversion of received light intensity to output signal) when the y-axis value of curve 702 crosses below the low threshold value 708 thus causes curve 712 to control the indication of proximity of the object to the display. The amount of increased transmitter light output (or the amount of other corresponding change in the conversion of received light intensity to output signal) when the y-axis value of curve 702 drops below the low threshold value 708 is chosen such that the y-axis value of the curve 712 is below a high threshold value 704, at which operation of the sensor switches from using curve 712 back to curve 702. Because the y-axis values of curve 712 do not drop below the enable threshold value 760, even for very small distances between the display and the object, a signal from the proximity sensor does not incorrectly indicate that the object is not close to the display when, in fact, it is very close to the display. When a y-axis value of the curve 712 increases above the high threshold value 704, the crossing of this threshold value 704 can be received as signal to the proximity sensor to switch to operating according to curve 702, so that when the display-to-object distance increases above the high threshold distance 710, the signal from the proximity sensor is properly understood as an indication that the object is not close to the display and the touchscreen and/or the display should be activated.

Figure 9:
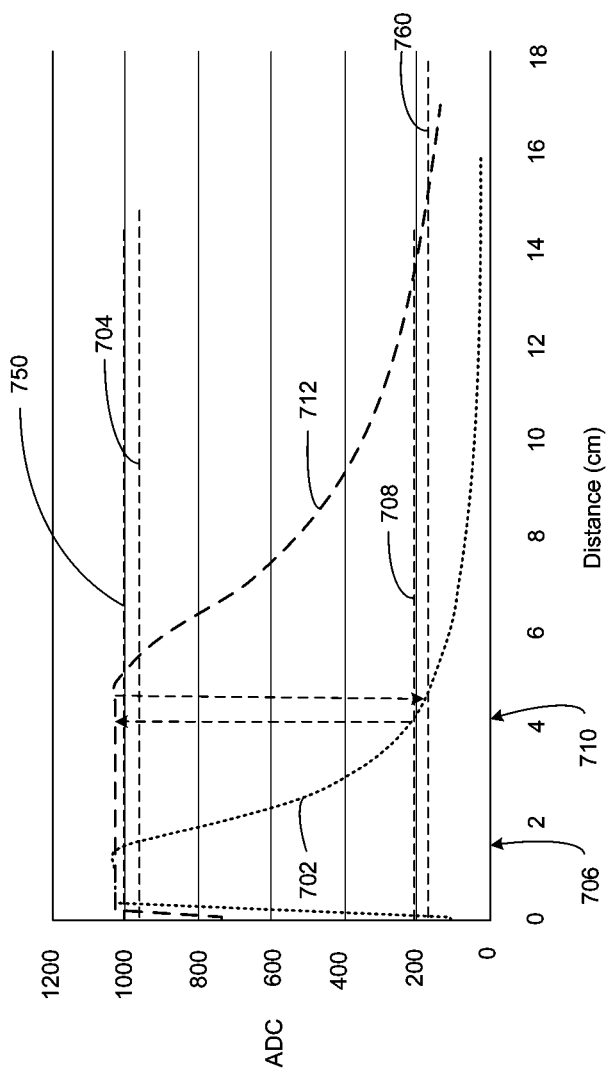
FIG. 9 depicts the graph of FIG. 7 annotated to show the operation of the proximity sensor around a high threshold distance.

FIG. 9 depicts the graph 700 annotated to show the operation of the proximity sensor around the high threshold distance 710. When a y-axis value of the curve 702 drops below the low threshold value 708 at the high threshold distance 710, a processor of the device may effect a change to cause the device to be controlled by ADC values from the second curve 712. However, because the y-axis value of curve 712 is above the high threshold value 704 at the high threshold distance 710, the device may be immediately again be controlled by curve 702. That is, a signal sequence of: 1) an ADC value decreasing below the lower threshold value 708 causing a switch from curve 702 to curve 712; and 2) an ADC value above the upper threshold value 704 maybe be interpreted as indicating the object-to-device distance is close to the high threshold distance, such that operation of the proximity sensor is changed such that output signal from the proximity sensor is given by curve 702 until the output signal increases above the high threshold value 704. This is in contrast to the operation of the proximity sensor around the near threshold distance 802, where a decrease of a y-axis value on curve 702 below the low threshold value 708 causes a change in the operation of the sensor, such that the output value from the sensor (as given by curve 712) does not exceed the high threshold value 704 and therefore the proximity sensor will continue to output signals corresponding to those of curve 712.

Figure 10:
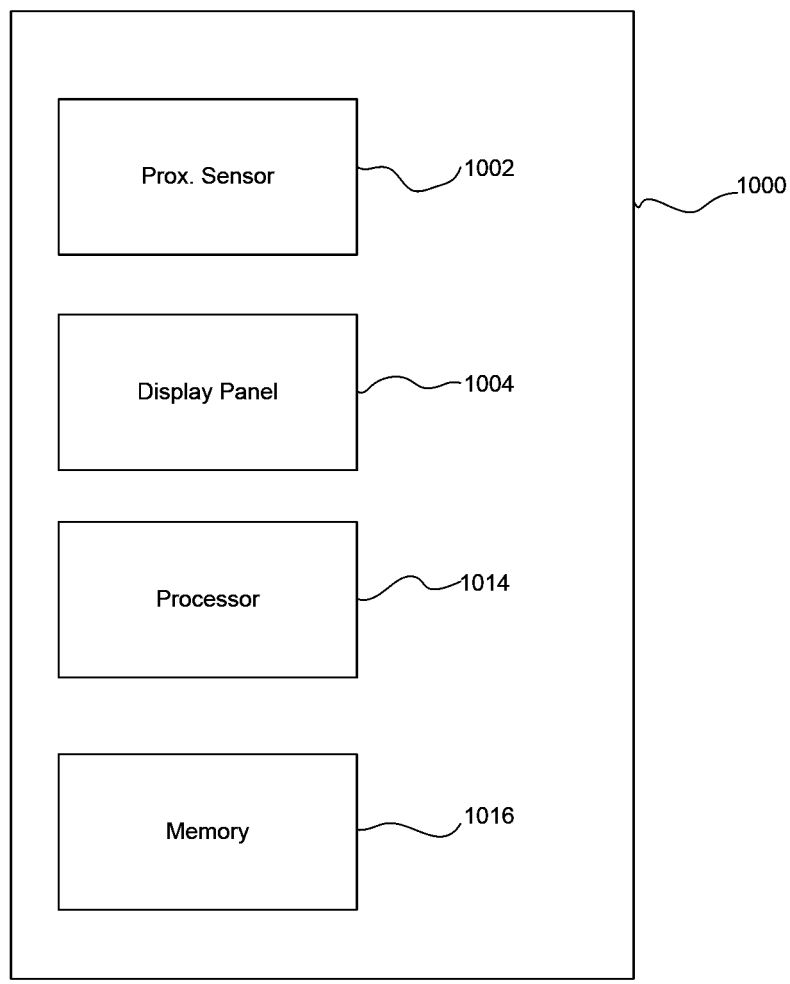
FIG. 10 is a schematic block diagram of a mobile device that includes a proximity sensor that transmits and receives electromagnetic radiation through a display panel.

FIG. 10 is a schematic block diagram of a mobile device 1000 that includes a proximity sensor 1002 that transmits and receives electromagnetic radiation through a display panel 1004. The mobile device 1000 can control the amount of light transmitted by the proximity sensor and/or can control a signal generated in response to light received by the transmitter, so as to avoid erroneous signals from the proximity sensor about the proximity of the display panel to an object external to the mobile device.

The mobile device 1000 can include at least one processor 1014. The at least one processor 1014 can execute instructions, such as instructions stored in at least one memory device 1016, to cause the mobile device 1000 to perform any combination of methods, functions, and/or techniques described herein.

The mobile device 1000 may include at least one memory device 1016. The at least one memory device 1016 can include a non-transitory computer-readable storage medium. The at least one memory device 1016 can store data and instructions thereon that, when executed by at least one processor, such as the processor 1014, are configured to cause the mobile device 1000 to perform any combination of methods, functions, and/or techniques described herein. Accordingly, in any of the implementations described herein (even if not explicitly noted in connection with a particular implementation), software (e.g., processing modules, stored instructions) and/or hardware (e.g., processor, memory devices, etc.) associated with, or included in, the mobile device 1000 can be configured to perform, alone, or in combination with the mobile device 1000, any combination of methods, functions, and/or techniques described herein.

The disclosed displays have been presented in the context of a mobile device, such as a tablet or a smart phone. The principles and techniques disclosed, however, may be applied more generally to any display in which it is desirable to position a sensor behind the display. For example, a virtual agent home terminal, a television, or an automatic teller machine (ATM) are a non-limiting set of alternative applications that could utilize a proximity sensor positioned behind an active area of a display. Further, the motivation for placing a proximity sensor behind a display is not limited to an expansion of the display to the edges of a device. For example, it may be desirable to place the proximity sensor behind a display for aesthetic or stealth reasons.

In the specification and/or figures, typical embodiments have been disclosed. The present disclosure is not limited to such exemplary embodiments. The use of the term "and/or" includes any and all combinations of one or more of the associated listed items. Unless otherwise noted, specific terms have been used in a generic and descriptive sense and not for purposes of limitation. As used in this specification, spatial relative terms (e.g., in front of, behind, above, below, and so forth) are intended to encompass different orientations of the device in use or operation in addition to the orientation depicted in the figures. For example, a "front surface" of a mobile computing device may be a surface facing a user, in which case the phrase "in front of" implies closer to the user. Additionally, a "top surface" of a display may be the surface facing a user, in which case the phrase "below" implies deeper into an interior of the mobile computing device.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

What is claimed is:

1. A mobile computing device comprising:
   an emissive display, wherein the display includes a touchscreen;
   a proximity sensor including a transmitter configured to transmit electromagnetic radiation through the display and a receiver of electromagnetic radiation configured to receive electromagnetic radiation transmitted by the transmitter, reflected off an object facing the emissive display and received through the emissive display, wherein the proximity sensor is configured for generating a quantitative output signal based on an amount of the received electromagnetic radiation, and wherein proximity sensor is configured to operate in a low sensitivity state and in a high sensitivity state; and
   one or more processors configured to:
      transition, when the sensor is operating in the low sensitivity state and in response to the quantitative output signal decreasing below a low threshold value, operation of the sensor to the high sensitivity state;
      transition, when the sensor is operating in the high sensitivity state and in response to the quantitative output signal increasing above a high threshold value that is greater than the low threshold value, operation of the sensor to the low sensitivity state; and
      deactivate the touchscreen and/or the emissive display when the quantitative output signal is greater than a deactivate threshold value and to activate the touchscreen and/or the emissive display when the quantitative output signal is below an activate threshold value, the activate threshold value being less than the deactivate threshold value.

2. The mobile computing device of claim 1,
   wherein the high threshold value is less than the deactivate threshold value, and
   wherein the low threshold value is greater than the activate threshold value.

3. The mobile computing device of claim 1, wherein in the low sensitivity state the transmitter transmits a first predetermined amount of light and in the high sensitivity state the transmitter transmits a second predetermined amount of light, the second predetermined amount being greater than the first predetermined amount.

4. The mobile computing device of claim 1, further comprising:
   an opaque layer between the display and the proximity sensor, the opaque layer having at least one opening through which the transmitted and received electromagnetic radiation pass.

5. The mobile computing device of claim 1, further including an opaque layer between the display and the proximity sensor, the opaque layer having a first opening configured for transmitting light from the transmitter through the display and a second opening, distinct from the first opening, configured for receiving light through the display to the receiver, wherein the first and second openings are spatially separated from each other.

6. The mobile computing device of claim 1, wherein a value of the generated quantitative output signal is proportional to the amount of the received electromagnetic radiation for amounts below a saturation value, and the value of the generated quantitative output signal is approximately constant for amounts above the saturation value.

7. The mobile computing device of claim 3, wherein the transmitter of the proximity sensor is configured to receive a signal to increase an amount of transmitted light from the first predetermined amount to the second predetermined amount when a value of the generated quantitative output signal decreases below the low threshold value.

8. The mobile computing device of claim 3, wherein the transmitter of the proximity sensor is configured to receive a signal to decrease an amount of transmitted light from the second predetermined amount to the first predetermined amount when a value of the generated quantitative output signal increases above the high threshold value.

9. The mobile computing device of claim 1, wherein the display includes an active matrix organic light emitting diode (AMOLED) display.

10. The mobile computing device of claim 1,
    wherein the display includes a high-resolution area and a through-transmissive area, the through-transmissive area including pixels that are spaced in a repeating pattern according to a first pixel density that is lower than a second pixel density of the high-resolution area; and
    wherein the proximity sensor is positioned behind the through-transmissive area, such that the transmitted and received electromagnetic radiation pass through the through-transmissive area.

11. The mobile computing device of claim 4, wherein the opaque layer includes a metal layer configured to spread heat through the metal layer.

12. The mobile computing device of claim 1,
    wherein a value of the generated quantitative output signal is proportional, with a first proportionality constant, to the amount of received electromagnetic radiation, for amounts below a first saturation value, when the proximity sensor is operating in the low sensitivity state, and wherein a value of the generated quantitative output signal is proportional, with a second proportionality constant, to the amount of received electromagnetic radiation, for amounts below a second saturation value, when the proximity sensor is operating in the high sensitivity state, the second proportionality constant being different from the first proportionality constant.

13. The mobile computing device of claim 12, wherein the receiver of the proximity sensor is configured to receive a signal to use the second proportionality constant rather than the first proportionality constant when a value of the generated quantitative output signal decreases below the low threshold value.

14. The mobile computing device of claim 12, wherein the receiver of the proximity sensor is configured to receive a signal to use the first proportionality constant rather than the second proportionality constant when a value of the generated quantitative output signal increases above the high threshold value.

15. The mobile computing device of claim 1, further comprising an amplifier configured to amplify a signal based on an amount of electromagnetic radiation received by the receiver, the amplifier having a first gain when the sensor is operating in the low sensitivity state and a second gain when the sensor is operating in the high sensitivity state.

16. A method comprising:
transmitting, by a transmitter of a proximity sensor of a device, electromagnetic radiation through an emissive display of the device, the emissive display including a touchscreen;
receiving, by a receiver of the proximity sensor, electromagnetic radiation transmitted by the transmitter, reflected off an object facing the emissive display and received through the emissive display, wherein the proximity sensor is configured for generating a quantitative output signal based on an amount of the received electromagnetic radiation, and wherein proximity sensor is configured to operate in a low sensitivity state and in a high sensitivity state;
transitioning, by the proximity sensor and while the proximity sensor is operating in the low sensitivity state and in response to the quantitative output signal decreasing below a low threshold value, to the high sensitivity state;
transitioning, by the proximity sensor and while the proximity sensor is operating in the high sensitivity state and in response to the quantitative output signal increasing above a high threshold value that is greater than the low threshold value, to the low sensitivity state;
deactivating the touchscreen and/or the emissive display responsive to the quantitative output signal being greater than a deactivate threshold value; and
activating the touchscreen and/or the emissive display responsive to the quantitative output signal being below an activate threshold value, the activate threshold value being less than the deactivate threshold value.

17. The method of claim 16,
wherein the high threshold value is less than the deactivate threshold value, and
wherein the low threshold value is greater than the activate threshold value.

18. The method of claim 17, wherein in the low sensitivity state the transmitter transmits a first predetermined amount of light and in the high sensitivity state the transmitter transmits a second predetermined amount of light, the second predetermined amount being greater than the first predetermined amount.

19. The method of claim 18, further comprising:
increasing, by the transmitter of the proximity sensor, an amount of transmitted light from the first predetermined amount to the second predetermined amount responsive to a value of the generated quantitative output signal decreasing below the low threshold value.

20. The method of claim 18, further comprising:
decreasing, by the transmitter of the proximity sensor, an amount of transmitted light from the second predetermined amount to the first predetermined amount responsive to a value of the generated quantitative output signal increasing above the high threshold value.

* * * * *